(12) United States Patent
Hu et al.

(10) Patent No.: US 12,205,671 B2
(45) Date of Patent: Jan. 21, 2025

(54) CIRCUIT STRUCTURE AND RELATED METHOD TO COMPENSATE FOR SENSE AMPLIFIER LEAKAGE

(71) Applicant: GlobalFoundries U.S. Inc., Malta, NY (US)

(72) Inventors: Xiaoli Hu, Shanghai (CN); Xiaoxiao Li, Shanghai (CN); Wei Zhao, Shanghai (CN); Yuqing Sun, Shanghai (CN); Xueqiang Dai, Nanjing (CN); Xiaohua Cheng, Shanghai (CN)

(73) Assignee: GlobalFoundries U.S. Inc., Malta, NY (US)

( * ) Notice: Subject to any disclaimer, the term of this patent is extended or adjusted under 35 U.S.C. 154(b) by 197 days.

(21) Appl. No.: 17/815,273

(22) Filed: Jul. 27, 2022

(65) Prior Publication Data
US 2024/0038283 A1 Feb. 1, 2024

(51) Int. Cl.
*G11C 7/14* (2006.01)
*G11C 7/06* (2006.01)

(52) U.S. Cl.
CPC ............ *G11C 7/14* (2013.01); *G11C 7/062* (2013.01)

(58) Field of Classification Search
None
See application file for complete search history.

(56) References Cited

U.S. PATENT DOCUMENTS

| | | | |
|---|---|---|---|
| 6,052,307 A | 4/2000 | Huber et al. | |
| 10,181,354 B2 | 1/2019 | Sheng et al. | |
| 10,475,510 B2 | 11/2019 | Yang et al. | |
| 11,475,926 B1 | 10/2022 | Li et al. | |
| 2004/0190334 A1 | 9/2004 | Baker | |
| 2006/0050548 A1* | 3/2006 | Oh | G11C 7/12 365/148 |
| 2011/0141824 A1* | 6/2011 | Fifield | G11C 7/12 365/225.7 |
| 2013/0265820 A1* | 10/2013 | Chih | G11C 11/1673 365/158 |
| 2016/0351267 A1 | 12/2016 | Tran et al. | |
| 2019/0348118 A1* | 11/2019 | Antonyan | G11C 16/0433 |
| 2022/0068341 A1* | 3/2022 | Tran | G11C 11/1673 |

* cited by examiner

*Primary Examiner* — J. H. Hur
(74) *Attorney, Agent, or Firm* — David Cain; Hoffman Warnick LLC (57) ABSTRACT

Embodiments of the disclosure provide a circuit structure and related method to compensate for sense amplifier leakage. A circuit structure according to the disclosure includes a reference voltage generator coupling a supply voltage and a reference line to a sense amplifier. A multiplexer within the reference voltage generator is coupled to the reference line. The multiplexer includes a plurality of transistors each having a gate terminal coupled to ground.

14 Claims, 4 Drawing Sheets

CIRCUIT STRUCTURE AND RELATED METHOD TO COMPENSATE FOR SENSE AMPLIFIER LEAKAGE

BACKGROUND

1. Technical Field

The present disclosure provides a circuit structure and related method to compensate for sense amplifier leakage.

2. Background Art

Many integrated circuit (IC) architectures include components for reading of data stored in bit cells, e.g., by amplifying a voltage level in the bit cell and comparing it to a reference voltage to characterize the data as being a logic low (e.g., a "zero") or a logic high (e.g., a "one"). The IC may include multiple sense amplifiers for amplifying the voltage of the selected bit cell. To read data from a selected bit cell, the sense amplifier may use a multiplexer to couple the selected bit cell to the amplification components. The multiplexer, however, may introduce significant current leakage through any transistors within a non-selected current path. The current leakage may be significant relative to the magnitude of the voltage within the selected bit cell. In some cases, this current leakage may cause the sense amplifier to mischaracterize a logic low as a logic high or vice versa.

SUMMARY

The illustrative aspects of the present disclosure are designed to solve the problems herein described and/or other problems not discussed.

Embodiments of the disclosure provide a circuit structure including: a reference voltage generator coupling a supply voltage and a reference line to a sense amplifier; and a multiplexer within the reference voltage generator and coupled to the reference line, the multiplexer including a plurality of transistors each having a gate terminal coupled to ground.

Another aspect of the disclosure includes any of the preceding aspects, and wherein the multiplexer includes a plurality of transistors configured to mirror a current leakage within the sense amplifier.

Another aspect of the disclosure includes any of the preceding aspects, and wherein the sense amplifier is one of a plurality of sense amplifiers coupled to the reference voltage generator, each of the plurality of sense amplifiers having a same current leakage from a column multiplexer.

Another aspect of the disclosure includes any of the preceding aspects, and wherein the multiplexer includes: a first transistor configured to mirror a current leakage in a two-to-one phase of the sense amplifier; a second transistor configured to mirror a current leakage in a four-to-one phase of the sense amplifier; and a third transistor configured to mirror a current leakage in an eight-to-one phase of the sense amplifier.

Another aspect of the disclosure includes any of the preceding aspects, and wherein the multiplexer is configured to reduce a reference current from the reference line by an amount approximately equal to a current leakage in the sense amplifier.

Another aspect of the disclosure includes any of the preceding aspects, and wherein the multiplexer is free of couplings to the sense amplifier.

Another aspect of the disclosure includes any of the preceding aspects, and wherein the sense amplifier is configured to compare a current from a selected bit cell with an output from the reference voltage generator to output a current indicating a logic level in the selected bit cell.

Other embodiments of the disclosure provide a circuit structure including: a reference voltage generator coupled to a supply voltage and a reference line to a sense amplifier; a multiplexer within the reference voltage generator and coupled to the reference line, the multiplexer including a plurality of transistors each having a gate terminal coupled to ground, wherein reference voltage generator outputs a reference voltage based on a reference current in the reference line, the supply voltage, and a current leakage in the multiplexer; and a plurality of sense amplifiers each coupled to the reference voltage generator, wherein each sense amplifier in the plurality of sense amplifiers includes an amplifier multiplexer having a same current leakage as the multiplexer.

Another aspect of the disclosure includes any of the preceding aspects, and wherein the plurality of transistors of the multiplexer are configured to mirror a current leakage within one of the plurality of sense amplifiers.

Another aspect of the disclosure includes any of the preceding aspects, and wherein the amplifier multiplexer of each of the plurality of sense amplifiers is of substantially uniform size.

Another aspect of the disclosure includes any of the preceding aspects, and wherein the multiplexer of the reference voltage generator has the substantially uniform size.

Another aspect of the disclosure includes any of the preceding aspects, and wherein the plurality of transistors of the multiplexer includes: a first transistor configured to mirror a current leakage in a two-to-one phase of the multiplexer of one of the plurality of sense amplifiers; a second transistor configured to mirror a current leakage in a four-to-one phase of the multiplexer of one of the plurality of sense amplifiers; and a third transistor configured to mirror a current leakage in an eight-to-one phase of the multiplexer of one of the plurality of sense amplifiers.

Another aspect of the disclosure includes any of the preceding aspects, and wherein the multiplexer is configured to reduce the reference current by an amount approximately equal to a current leakage in each of the plurality of sense amplifiers.

Another aspect of the disclosure includes any of the preceding aspects, and wherein the multiplexer is free of couplings to any of the plurality of sense amplifiers.

Additional embodiments of the disclosure provide a method for generating a reference voltage for at least one sense amplifier, the method including: transmitting a supply voltage and a reference current to a reference voltage generator to output the reference voltage, wherein the reference voltage generator includes a multiplexer coupled to a reference line, the multiplexer including a plurality of transistors each having a gate terminal coupled to ground; and transmitting the reference voltage to a plurality of sense amplifiers, wherein each of the plurality of sense amplifiers includes an amplifier multiplexer having a same current leakage as the multiplexer.

Another aspect of the disclosure includes any of the preceding aspects, and wherein the multiplexer includes a plurality of transistors configured to mirror a current leakage within one of the plurality of sense amplifiers.

Another aspect of the disclosure includes any of the preceding aspects, and wherein the plurality of transistors of the multiplexer includes: a first transistor configured to mirror a current leakage in a two-to-one phase of the sense amplifier; a second transistor configured to mirror a current leakage in a four-to-one phase of the sense amplifier; and a third transistor configured to mirror a current leakage in an eight-to-one phase of the sense amplifier.

Another aspect of the disclosure includes any of the preceding aspects, and wherein transmitting the supply voltage and the reference current to the reference voltage generator causes the plurality of transistors of the multiplexer to mirror a current leakage within one of the plurality of sense amplifiers.

Another aspect of the disclosure includes any of the preceding aspects, and wherein transmitting the supply voltage and the reference current to the reference voltage generator causes the multiplexer to reduce the reference current by an amount approximately equal to a current leakage in the sense amplifier.

Another aspect of the disclosure includes any of the preceding aspects, and further including comparing, via the sense amplifier, a voltage in a selected bit cell with the reference voltage to output a voltage indicating a logic level in the selected bit cell.

Two or more aspects described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a circuit structure and related method to compensate for sense amplifier leakage. A circuit structure according to the disclosure includes a reference voltage generator for coupling a supply voltage and a reference line to a sense amplifier. The reference voltage generator transmits a voltage to each of a large number of sense amplifiers for reading the logic level(s) stored in a column of bit cells within a memory array. A multiplexer is within the reference voltage generator and coupled to the reference line. The multiplexer includes several transistors each having a gate terminal coupled to ground. During operation, the multiplexer induces a current leakage from the reference current and thus reduces the reference voltage output from the reference voltage generator. This current leakage induced in the multiplexer mimics a current leakage induced in each sense amplifier. Thus, the reference current generator compensates for current loss within the sense amplifiers for the memory array.

Figure 1:
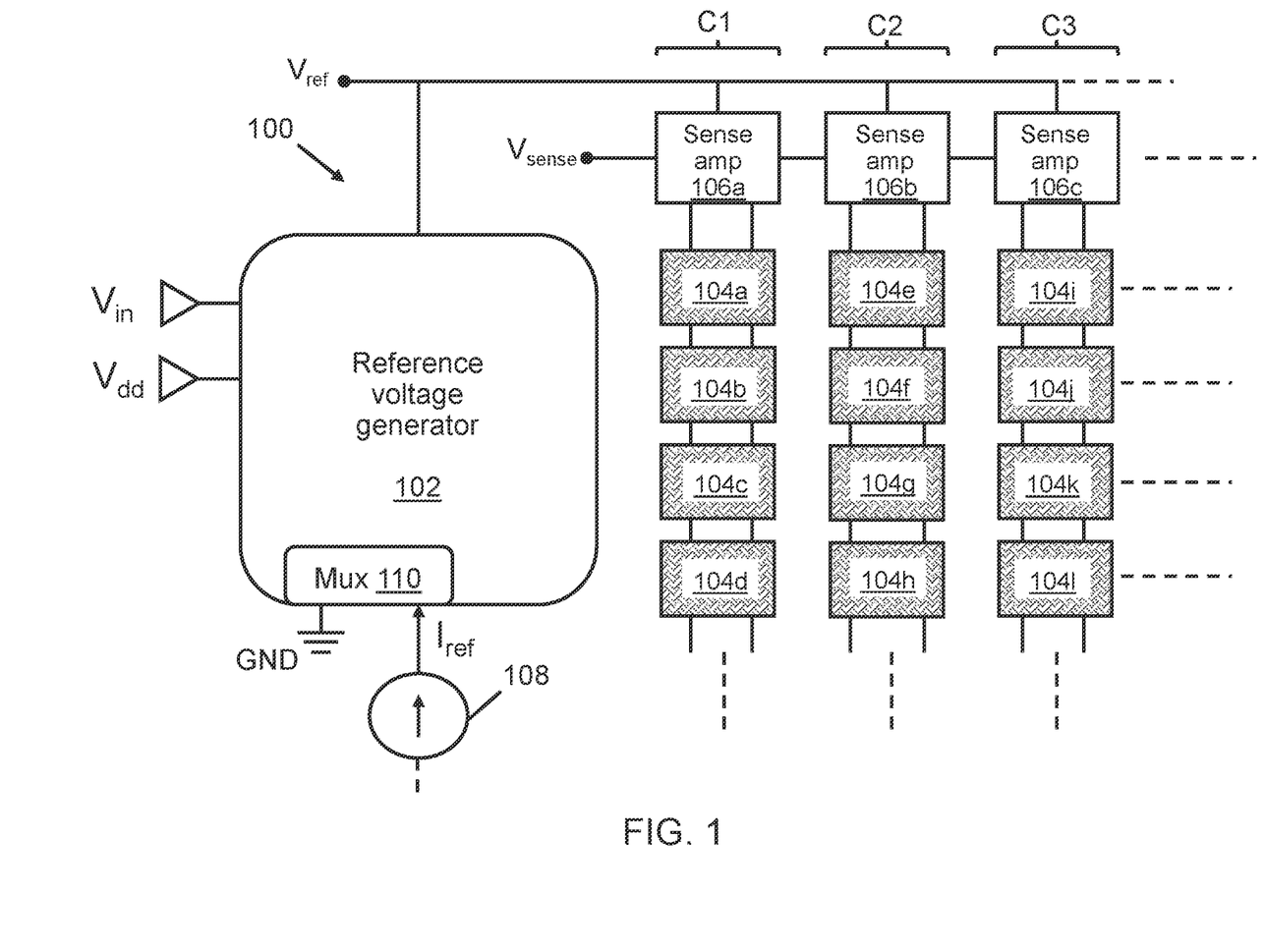
FIG. 1 shows a schematic diagram of a reference voltage generator, a set of sense amplifiers, and a group of bit cells according to embodiments of the disclosure.

FIG. 1 depicts a circuit structure (simply "structure" hereafter) 100 according to embodiments of the disclosure. Structure 100 may include a reference voltage generator 102 configured to generate a reference voltage ($V_{ref}$) proportionate to a reference current ($I_{ref}$) and an input voltage ($V_{in}$) using a supply voltage ($V_{dd}$). Reference voltage generator 102 outputs reference voltage $V_{ref}$ to be compared with an amplified voltage level within a selected bit cell 104 in one or more sense amplifiers (also known as "sense amps") 106 as discussed herein. A current source 108, which may be fixed, temperature dependent, voltage dependent, etc., delivers reference current $I_{ref}$ to reference voltage generator 102, which converts reference current $I_{ref}$ to reference voltage $V_{ref}$ as discussed herein.

An input voltage $V_{in}$ may be used to amplify reference current $I_{ref}$ to generate a voltage magnitude suitable for comparison in sense amplifiers 106. Reference voltage generator 102 may include a multiplexer 110 ("Mux") coupled to ground (GND) to compensate for current leakage(s) in sense amplifiers 106. As will be discussed in further detail herein, multiplexer 110 couples to a line for carrying reference current $I_{ref}$ to ground GND, thus intentionally inducing current leakage within reference voltage generator 102. Multiplexer 110 may include several transistors to replicate non-selected current pathways in one sense amplifier 106 to replicate the parasitic voltage loss within sense amplifier(s) 106.

Structure 100 may include one reference voltage generator 102 but further may include multiple bit cells 104 (separately labeled 104a-104l) and sense amplifiers 106 (separately labeled 106a-106c) for storing and accessing data. Each sense amplifier 106a-106c may be coupled to reference voltage generator 102 and thus may have an input node that is set to reference voltage $V_{ref}$. Sense amplifiers 106a-106c may be arranged in columns (three columns C1, C2, C3 shown as an example) such that each sense amplifier 106a-106c may access each bit cell 104 in a particular column. It is understood that in further implementations, structure 100 may include an array of bit cells 104 arranged in hundreds of columns or more, and hence may include any conceivable number of bit cells 104.

In the example of FIG. 1, bit cells 104a-104d are in column C1 and coupled to sense amplifier 106a, bit cells 104e-104h are in column C2 and coupled to sense amplifier 106b, and bit cells 104i-104l are in column C3 and coupled to sense amplifier 106c. Each sense amplifier 106a-106c may amplify the voltage level in a selected bit cell 104 in its respective column C1, C2, C3, to compare the amplified voltage to reference voltage $V_{ref}$. Based on the comparison, sense amplifiers 106a-106c may indicate a logic low (i.e., a "zero" bit) if the detected current is less than reference current $I_{ref}$, or a logic high (i.e., a "one" bit) if the detected is equal to or greater than reference current $I_{ref}$. Some embodiments of structure 100 may invert the logic levels output from sense amplifiers 106a-106c. In any case, sense amplifier(s) 106a-106c may produce a sensed voltage $V_{sense}$ as a logic signal transmitted to other components, e.g., during a read operation to retrieve data from bit cells 104.

Figure 2:
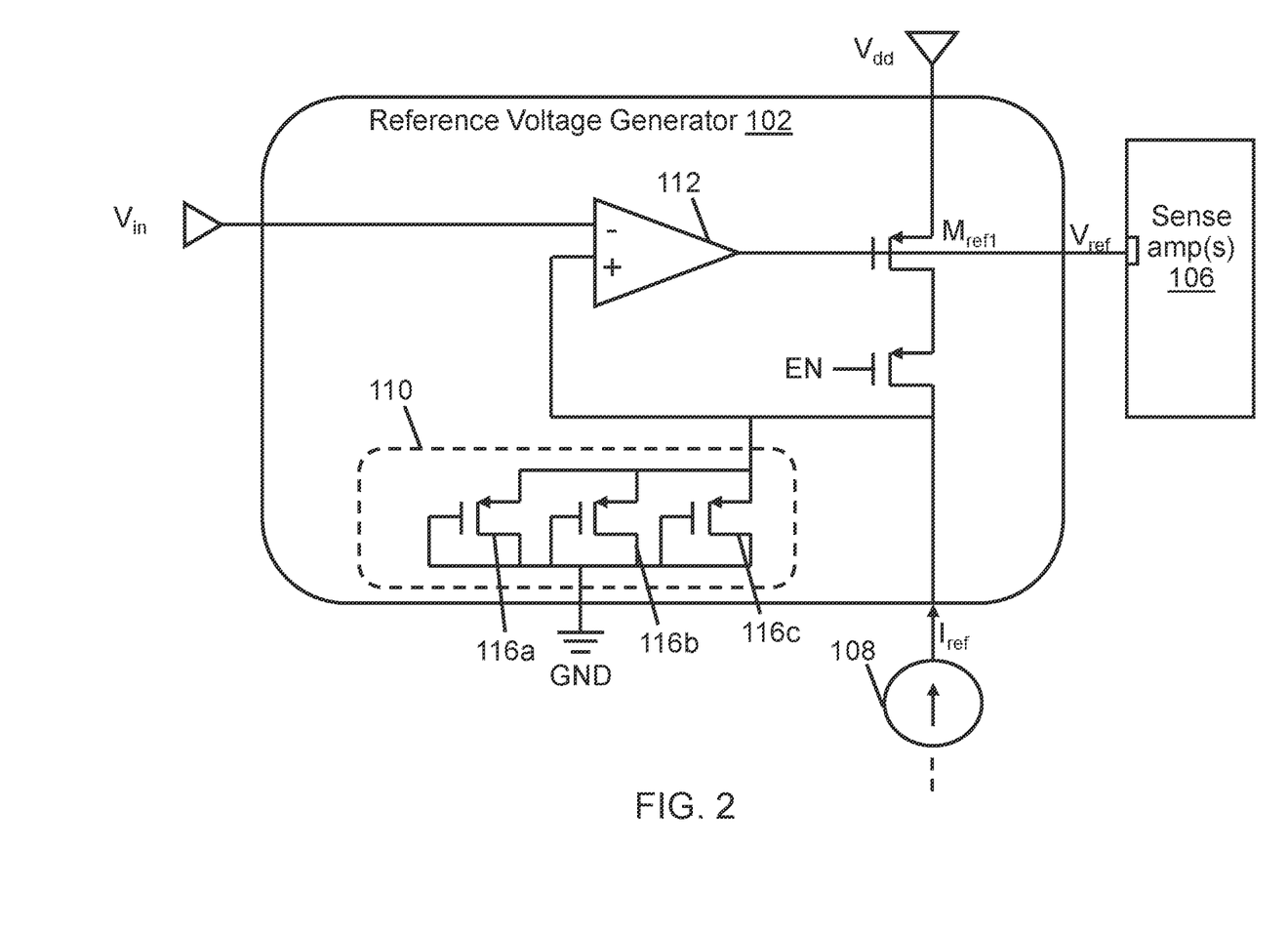
FIG. 2 shows an expanded schematic diagram of a reference voltage generator to compensate for sense amplifier leakage according to embodiments of the disclosure.
Figure 3:
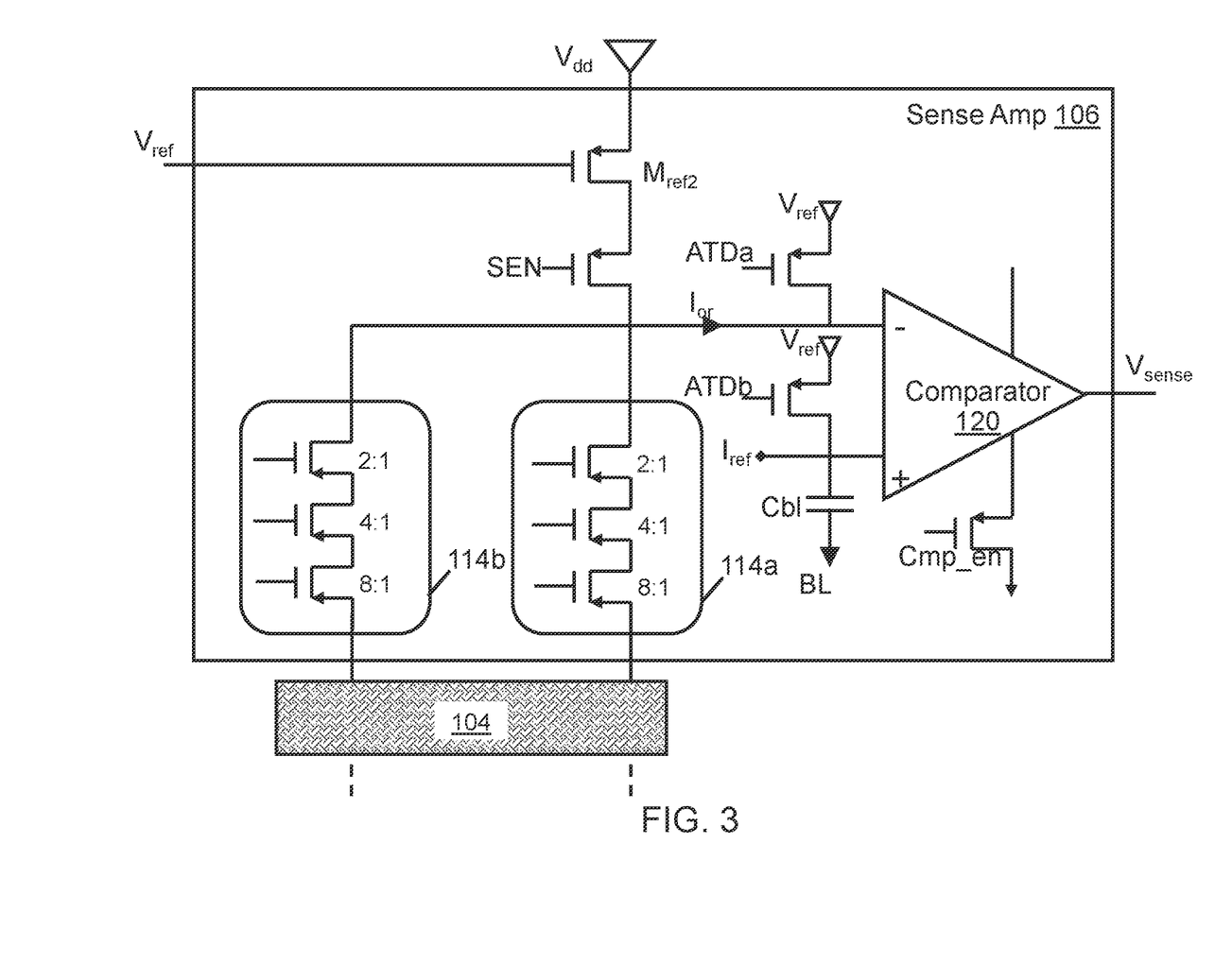
FIG. 3 shows an expanded schematic diagram of a sense amplifier coupled to the reference voltage generator according to embodiments of the disclosure.

FIGS. 2 and 3 provide expanded circuit diagrams of reference voltage generator 102 and one sense amplifier 106, respectively, to further illustrate how reference voltage generator 102 compensates for leakage currents in each sense amplifier 106. Sense amplifier 106 illustrated in FIG. 3 may represent any or all sense amplifiers 106a-106l shown in FIG. 1 and discussed elsewhere herein. That is, each sense amplifier 106a-106l may be substantially identical such that any current leakage from any sense amplifier 106 is indistinguishable from the current leakage from any other sense amplifier 106. Reference voltage generator 102 may be coupled to input voltage $V_{in}$, supply voltage $V_{dd}$, and a reference line transmitting reference current $I_{ref}$ from current source 108 as discussed herein.

Reference voltage generator 102 may include a reference transistor $M_{ref1}$ having a source or drain coupled to supply voltage $V_{dd}$, and the opposite source or drain terminal may be coupled to the source or drain of an enabling transistor EN. Enabling transistor EN, in turn may be coupled to reference current $I_{ref}$ through its other source or drain terminal. The gate voltage of enabling transistor EN may control whether reference voltage generator 102 operates, i.e., reference voltage generator 102 may output a reference voltage only when enabling transistor EN is turned on. The gate terminal of reference transistor $M_{ref1}$ may be coupled to the output of an amplifier 112 for outputting reference voltage $V_{ref}$ to sense amplifier 106. Amplifier 112 may include, e.g., a transimpedance amplifier (TIA) and/or any other component suitable for converting an input current into an output voltage based on an input voltage (e.g., input voltage $V_{in}$) provided thereto.

As shown, amplifier 112 includes one terminal coupled to input voltage $V_{in}$ and another terminal coupled to reference current $I_{ref}$ and multiplexer 110. Multiplexer 110 is included within reference voltage generator 102 to mimic current leakage from a set of amplifier multiplexers 114 included within sense amplifier 106. Multiplexer 110 may include a set of transistors 116 each having a gate terminal and one source or drain terminal coupled to ground (GND), and another source or drain terminal coupled at a node junction to reference current $I_{ref}$ and the current input of amplifier 112. Transistors 116 of multiplexer 110 are distinct from other transistors of reference voltage generator 102 and any other multiplexers of structure 100 by never having a gate voltage applied thereto. Instead, transistors 116 of multiplexer 110 deliberately introduce a leakage current to reference voltage generator 102. Moreover, transistors 116 of multiplexer 110 are free of any couplings to sense amplifiers 106, and hence directly couple the junction between amplifier 112 and current source 108 to ground GND. By application of Kirchhoff's circuit laws (i.e., the current entering any junction is equal to the current leaving that junction), the current transmitted to amplifier 112 will be reference current $I_{ref}$ minus the leakage current passing through multiplexer 110. Hence, amplifier 112 will produce a reference voltage $V_{ref}$ that is less than would otherwise be produced if reference current $I_{ref}$ alone were transmitted to amplifier 112. The current leakage in multiplexer 110 thus compensates for any current leakage of amplifier multiplexers 114 in sense amplifiers 106 as discussed herein.

In each sense amplifier 106, reference voltage $V_{ref}$ is transmitted to the gate terminal of a second reference transistor $M_{ref2}$ to couple supply voltage $V_{dd}$ to amplifier multiplexers 114 and bit cell(s) 104 through second reference transistor $M_{ref2}$ and a sense enabling transistor SEN. Sense amplifier 106 may be enabled by applying a threshold voltage to the gate of sense enabling transistor SEN or disabled by not applying the threshold voltage to sense enabling transistor SEN.

Figure 4:
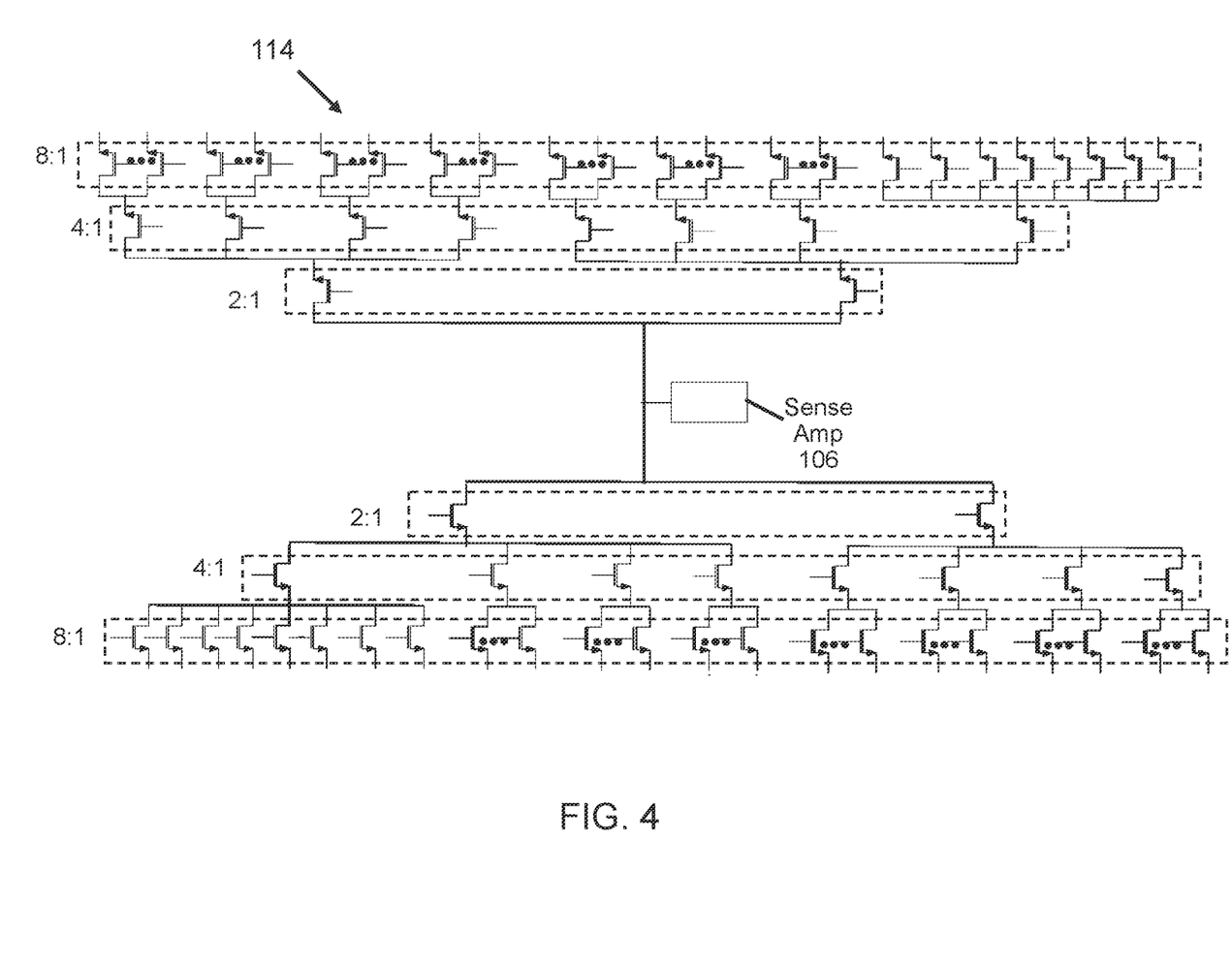
FIG. 4 shows a schematic diagram of a three-stage multiplexer to select a bit cell for reading according to embodiments of the disclosure.

Referring to FIGS. 3 and 4 together, amplifier multiplexers 114 may include an input multiplexer 114a for coupling supply voltage $V_{dd}$ to bit cell(s) 104, and an output multiplexer 114b for coupling bit cell(s) 104 to sense amplifier 106, e.g., to convey a read signal to a selected bit cell 104 and transmit a voltage from the selected bit cell 104 back to sense amplifier 106. Each amplifier multiplexer 114 of sense amplifier 106 may include multiple transistors subdivided into several stages, based on the number of bit cells 104 to which sense amplifier 106 connects. In the example shown in FIG. 3, amplifier multiplexers 114 provide a one-to-sixty-four selection scheme subdivided into a one-to-two (2:1) stage, a one-to-four (4:1) stage, and a one-to eight (8:1) stage. At each stage, supply voltage $V_{dd}$ is coupled to one bit cell 104 by enabling current flow through only one of the transistors in each stage. However, some leakage current nonetheless may flow through all non-selected transistors. This effect may be especially pronounced, e.g., in the selection scheme shown in FIG. 4 where a significant number (e.g., sixty-three) non-selected transistors are present in each amplifier multiplexer 114. Since each device will include multiple sense amplifiers 106 and hence an even larger number of amplifier multiplexers 114, embodiments of the disclosure compensate for the ensuing current leakage by mirroring the leakage current through multiplexer 110 (FIGS. 1, 2) of reference voltage generator 102. The mirrored leakage current in turn will affect reference voltage $V_{ref}$ as discussed herein.

Referring again to FIGS. 2 and 3, the coupling of supply voltage $V_{dd}$ to one bit cell 104 through amplifier multiplexers 114a, 114b may produce an output current $I_{or}$. Output current $I_{or}$ may be proportionate to the voltage stored in bit cell 104. Sense amplifier 106 may transmit output current $I_{or}$ to one terminal of a comparator 120. An access transistor ATDa may couple the first terminal of comparator 120 to reference voltage $V_{ref}$, e.g., to electrically drive the transmitting of output current $I_{or}$ to comparator 120. Another terminal of comparator 120 may be coupled to a mirror of reference current $I_{ref}$, and another access transistor ATDb may couple reference voltage $V_{ref}$ to the other terminal of comparator 120. A bit line capacitor Cbl may couple the other terminal of comparator 120 to a bit line BL. A comparator enabling transistor Cmp_en may selectively enable or disable the operation of comparator 120, e.g., based on the operating state of sense amplifier 106.

Comparator 120 may compare output current $I_{or}$ from bit cell with reference current $I_{ref}$ to generate a sensed voltage $V_{sense}$ indicating a high logic level or a low logic level. When output current $I_{or}$ is less than reference current $I_{ref}$, comparator 120 may produce a low voltage, whereas comparator 120 may produce a high voltage when output current $I_{or}$ is equal to or greater than reference current $I_{ref}$. Reference voltage $V_{ref}$ is coupled to sense amplifier 106 to electrically drive the functions of comparator 120. Thus, the induced leakage current in reference voltage generator 102 will reduce reference voltage $V_{ref}$ by an amount corresponding to the leakage current in amplifier multiplexers 114. Each sense amplifier 106 may have the same number of transistors in its amplifier multiplexers 114, and each amplifier multiplexer 114 of structure 100 may be of substantially uniform size. Hence, each sense amplifier 106 may have the same amount of current leakage. Reference voltage generator 102 thus may adequately compensate for leakage current regardless of which sense amplifier 106 of structure 100 is operating. In turn, this increases the accuracy of comparator 120 and reduces logic errors in the voltage level in sensed voltage $V_{sense}$.

Embodiments of the disclosure provide a method for generating reference voltage $V_{ref}$ for sense amplifier(s) 106 using reference voltage generator 102. Embodiments of the disclosure may include transmitting supply voltage $V_{dd}$ and reference current $I_{ref}$ to output reference voltage $V_{ref}$, in which reference voltage generator 102 includes multiplexer 110. Multiplexer 110 includes transistors 116a-116c each having a gate terminal coupled to ground GND. Transistors 116a-116c are configured to mirror the current leakage in amplifier multiplexer 114a, 114b of one sense amplifier 106 and thus reduce the magnitude of reference current $I_{ref}$ (e.g., by action of Kirchhoff's Laws as discussed herein) before it reaches amplifier 112, thus reducing the magnitude of reference voltage $V_{ref}$ generated from reference voltage generator 102. In an example implementation, transistors 116 of multiplexer 110 may include three transistors each corresponding to a two-to-one phase, a four-to-one phase, and an eight-to-one phase of each amplifier multiplexer 114 in one sense amplifier 106. The method then concludes transmitting reference voltage $V_{ref}$ to a group of sense amplifiers 106, each sense amplifier 106 having multiplexers 114 with the same current leakage as multiplexer 110. Embodiments of the disclosure may include comparing, in comparator 120 of sense amplifier(s) 106, the voltage sensed in a selected bit line (e.g., via output current $I_{or}$ and supply voltage $V_{dd}$) and reference voltage $V_{ref}$ (e.g., using a mirror of reference current $I_{ref}$) to output a sensed voltage $V_{sense}$ indicating the logic level of the selected bit cell 104.

Embodiments of the disclosure may provide several technical advantages, examples of which are discussed herein. Embodiments of the disclosure provide reference voltage generator 102 with structural modifications to compensate for current leakage within each sense amplifier 106, but without otherwise modifying the structure and operation of any sense amplifiers 106. Since sense amplifiers 106 are highly repeated in structure 100, modifying of sense amplifiers 106 will introduce significant manufacturing and operating costs (e.g., including additional surface area occupied by additional sense amplifier 106 subcomponents). Embodiments of the disclosure compensate for current leakage by including multiplexer 110 within reference voltage generator 102, e.g., to mirror the known current leakage in each sense amplifier 106. Rather than trying to eliminate current leakage from sense amplifiers 106 during operation, structure 100 according to the disclosure and related methods anticipate the current leakage in sense amplifiers 106 and compensate for such losses using multiplexer 110 of reference voltage generator 102. Moreover, multiplexer 110 is coupled between one amplifier 112 terminal and ground GND, thus not requiring additional signal processing and/or electrical control of its transistors 116.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A circuit structure comprising:
   a reference voltage generator coupling a supply voltage and a reference line to a sense amplifier having a plurality of phases; and
   a multiplexer within the reference voltage generator and coupled to the reference line, the multiplexer including a plurality of transistors each configured to mirror a current leakage within a respective phase of the sense amplifier and having a gate terminal coupled to ground,
   wherein each respective phase of the sense amplifier differs from at least one other phase of the sense amplifier.

2. The circuit structure of claim 1, wherein the sense amplifier is one of a plurality of sense amplifiers coupled to the reference voltage generator, each of the plurality of sense amplifiers having a column multiplexer with the plurality of phases, wherein the plurality of phases within each column multiplexer has a same current leakage.

3. The circuit structure of claim 1, wherein the plurality of transistors includes:
   a first transistor configured to mirror a current leakage in a two-to-one phase, of the plurality of phases of the sense amplifier;
   a second transistor configured to mirror a current leakage in a four-to-one phase, of the plurality of phases of the sense amplifier; and
   a third transistor configured to mirror a current leakage in an eight-to-one phase, of the plurality of phases of the sense amplifier.

4. The circuit structure of claim 1, wherein the multiplexer is configured to reduce a reference current from the reference line by an amount approximately equal to the-current leakage in the sense amplifier.

5. The circuit structure of claim 1, wherein the sense amplifier is configured to compare a current from a selected bit cell with an output from the reference voltage generator to output a current indicating a logic level in the selected bit cell.

6. A circuit structure comprising:
   a reference voltage generator coupled to a supply voltage and a reference line to a plurality of sense amplifiers each having an amplifier multiplexer with a plurality of phases;
   a multiplexer within the reference voltage generator and coupled to the reference line, the multiplexer including a plurality of transistors each configured to mirror a current leakage within a respective phase of a respective sense amplifier of the plurality of sense amplifiers and having a gate terminal coupled to ground, wherein the reference voltage generator outputs a reference voltage based on a reference current in the reference line, the supply voltage, and the current leakage and
   wherein each respective phase of the sense amplifier, of the plurality of sense amplifiers, differs from at least one other phase of the sense amplifier.

7. The circuit structure of claim 6, wherein each amplifier multiplexer is of substantially uniform size.

8. The circuit structure of claim 6, wherein the multiplexer and each amplifier multiplexer are of substantially uniform size.

9. The circuit structure of claim 6, wherein the plurality of transistors of the multiplexer includes:
   a first transistor configured to mirror a current leakage in a two-to-one phase, of the plurality of phases of the amplifier multiplexer of one of the plurality of sense amplifiers;
   a second transistor configured to mirror a current leakage in a four-to-one phase, of the plurality of phases of the amplifier multiplexer of one of the plurality of sense amplifiers; and
   a third transistor configured to mirror a current leakage in an eight-to-one phase, of the plurality of phases of the amplifier multiplexer of one of the plurality of sense amplifiers.

10. The circuit structure of claim 6, wherein the multiplexer within the reference voltage generator is configured to reduce the reference current by an amount approximately equal to a current leakage in each of the plurality of sense amplifiers.

11. A method for generating a reference voltage for at least one sense amplifier of a plurality of sense amplifiers, each sense amplifier having an amplifier multiplexer with a plurality of phases, the method comprising:
    transmitting a supply voltage and a reference current to a reference voltage generator to output the reference voltage, wherein the reference voltage generator includes a multiplexer coupled to a reference line, the multiplexer including a plurality of transistors each configured to mirror a current leakage within a respective phase of the sense amplifier and having a gate terminal coupled to ground; and
    transmitting the reference voltage to the plurality of sense amplifiers,
    wherein each respective phase of the sense amplifier, of the plurality of sense amplifiers, differs from at least one other phase of the sense amplifier.

12. The method of claim 11, wherein the multiplexer mirrors the current leakage current through:

a first transistor, of the plurality of transistors, configured to mirror a current leakage in a two-to-one phase, of the plurality of phases of the sense amplifier;

a second transistor, of the plurality of transistors, configured to mirror a current leakage in a four-to-one phase, of the plurality of phases of the sense amplifier; and a third transistor, of the plurality of transistors, configured to mirror a current leakage in an eight-to-one phase, of the plurality of phases of the sense amplifier.

13. The method of claim 11, wherein transmitting the supply voltage and the reference current to the reference voltage generator causes the multiplexer of the reference voltage generator to reduce the reference current by an amount approximately equal to a current leakage in the sense amplifier.

14. The method of claim 11, further comprising comparing, via the sense amplifier, a voltage in a selected bit cell with the reference voltage to output a voltage indicating a logic level in the selected bit cell.

* * * * *